(12) United States Patent
Kizaki

(10) Patent No.: US 7,535,159 B2
(45) Date of Patent: May 19, 2009

(54) TUNING FORK CRYSTAL OSCILLATION PLATE AND METHOD OF MANUFACTURING THE SAME

(75) Inventor: Shigeru Kizaki, Tokyo (JP)

(73) Assignees: Kyocera Kinseki Corporation, Tokyo (JP); Kyocera Kinseki Hertz Corporation, Tokyo (JP)

( * ) Notice: Subject to any disclaimer, the term of this patent is extended or adjusted under 35 U.S.C. 154(b) by 0 days.

(21) Appl. No.: 11/895,214

(22) Filed: Aug. 21, 2007

(65) Prior Publication Data

US 2008/0054763 A1 Mar. 6, 2008

(51) Int. Cl.
*H03H 9/21* (2006.01)
(52) U.S. Cl. ..................................... 310/370
(58) Field of Classification Search ............ 310/370, 310/340; 333/200, 186, 150; H03H 3/04, H03H 9/21
See application file for complete search history.

(56) References Cited

U.S. PATENT DOCUMENTS 3,969,641 A 7/1976 Oguchi et al.
6,897,737 B2 * 5/2005 Sakata et al. ............... 310/370
7,279,824 B2 * 10/2007 Tanaya et al. ............... 310/370
7,352,117 B2 * 4/2008 Kawanishi et al. .......... 310/370

FOREIGN PATENT DOCUMENTS

| JP | 52-061985 A | 5/1977 |
| JP | 56-065517 A | 6/1981 |
| JP | 2004-159072 A | 6/2004 |
| JP | 3729249 B | 10/2005 |
| WO | WO 00/44092 A | 7/2000 |

* cited by examiner

*Primary Examiner*—Quyen P Leung
*Assistant Examiner*—Karen B Addison
(74) *Attorney, Agent, or Firm*—Blakely, Sokoloff, Taylor & Zafman LLP

(57) ABSTRACT

A tuning fork crystal oscillation plate includes a tuning fork crystal oscillation piece, first and second grooves, first and second groove electrodes, first side surface electrodes, and second side surface electrodes. The first groove electrode is connected to the second side surface electrodes to constitute one terminal. The second groove electrode is connected to the first side surface electrodes to constitute the other terminal. A method of manufacturing a tuning fork crystal oscillation plate is also disclosed.

7 Claims, 9 Drawing Sheets

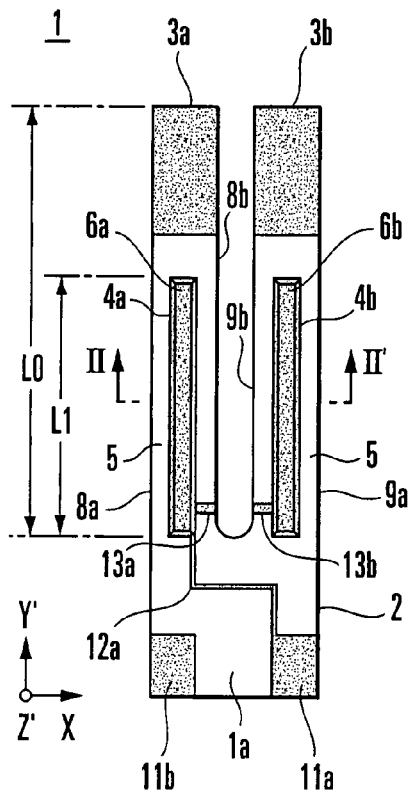
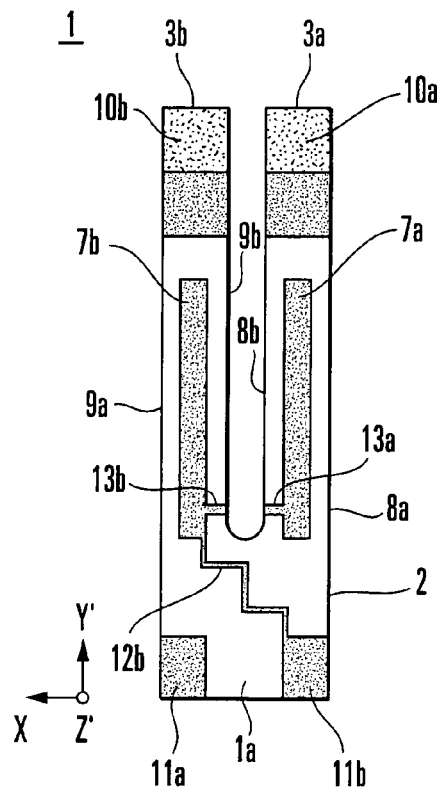
FIG. 1A  FIG. 1B
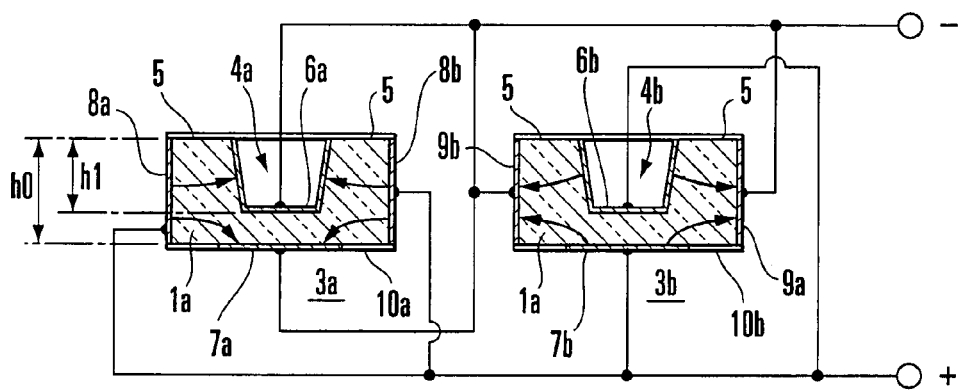
FIG. 2

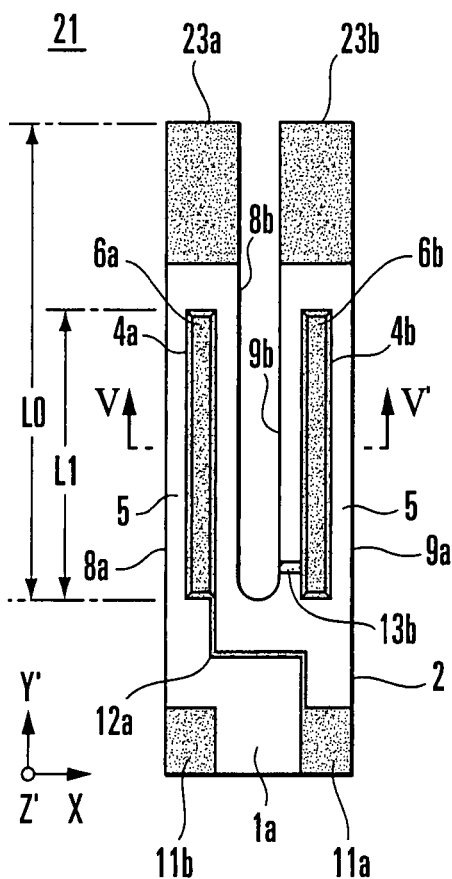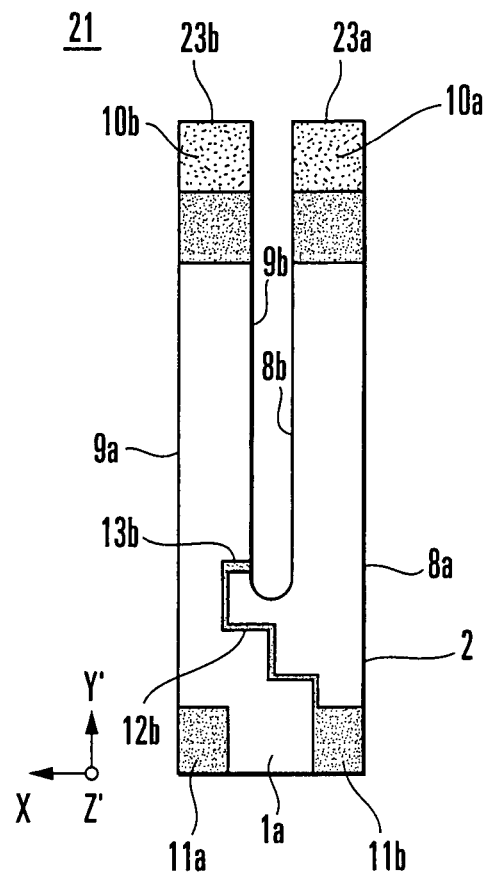
FIG.4A  FIG.4B
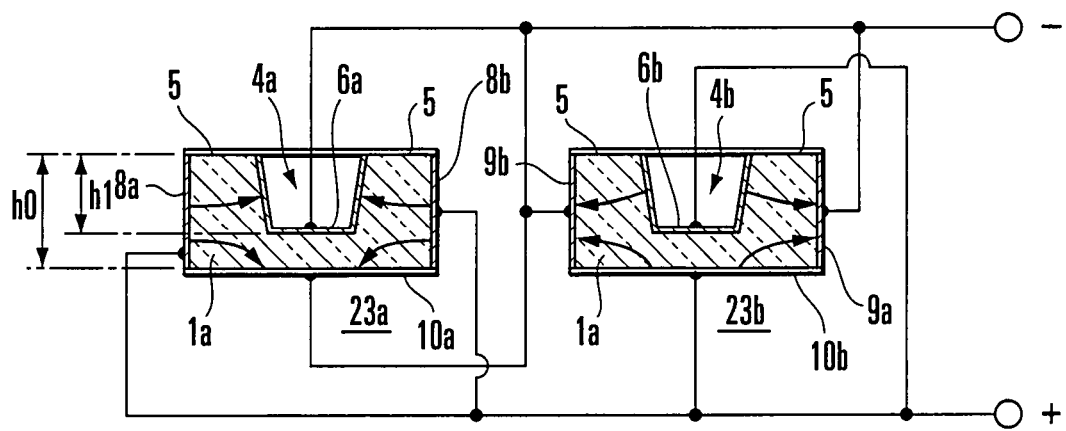
FIG.5

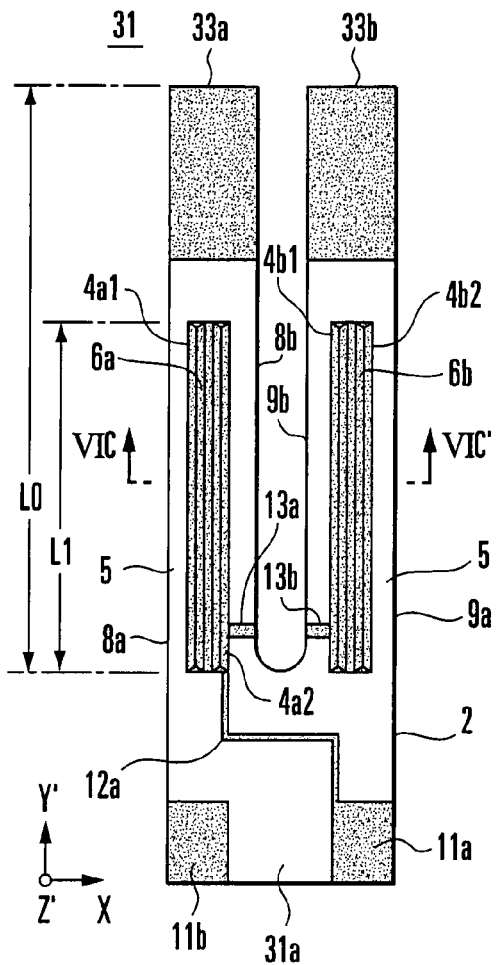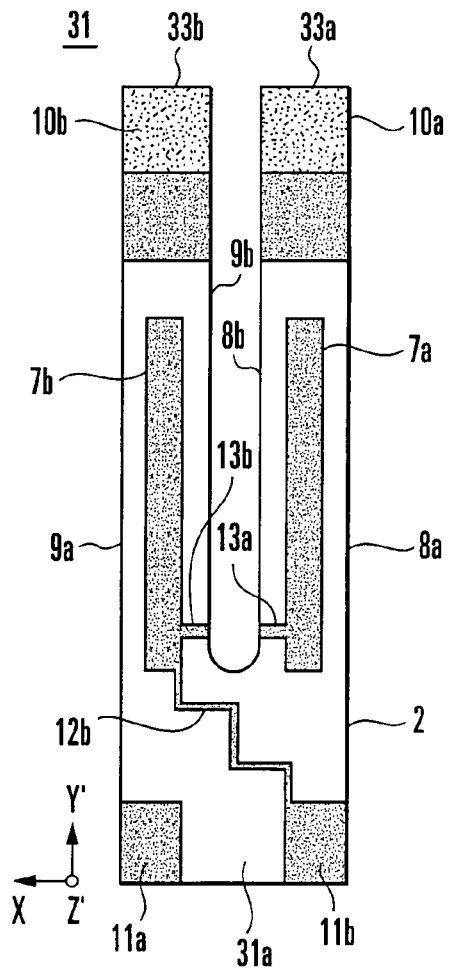
FIG.6A    FIG.6B
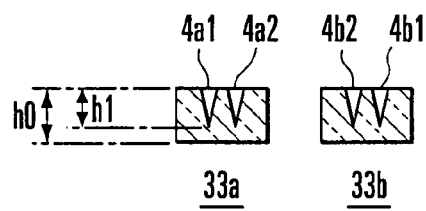
FIG.6C

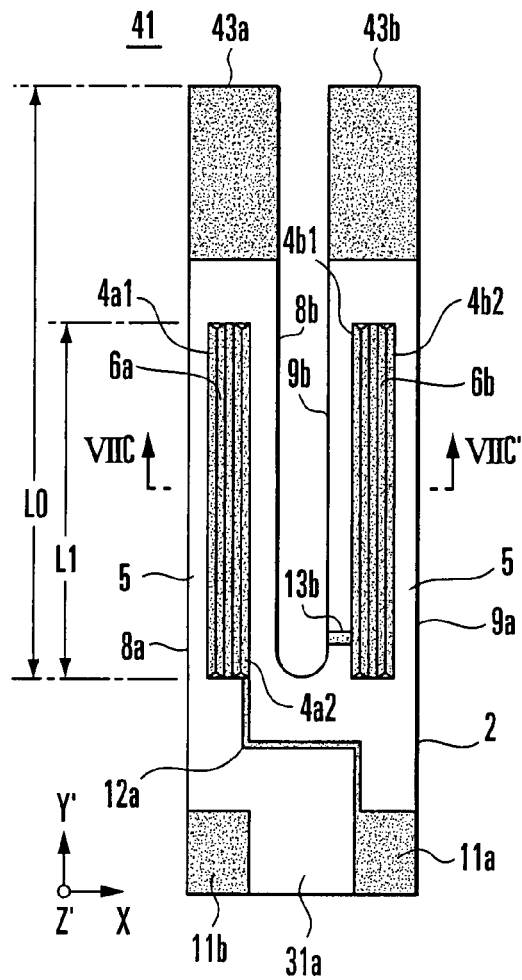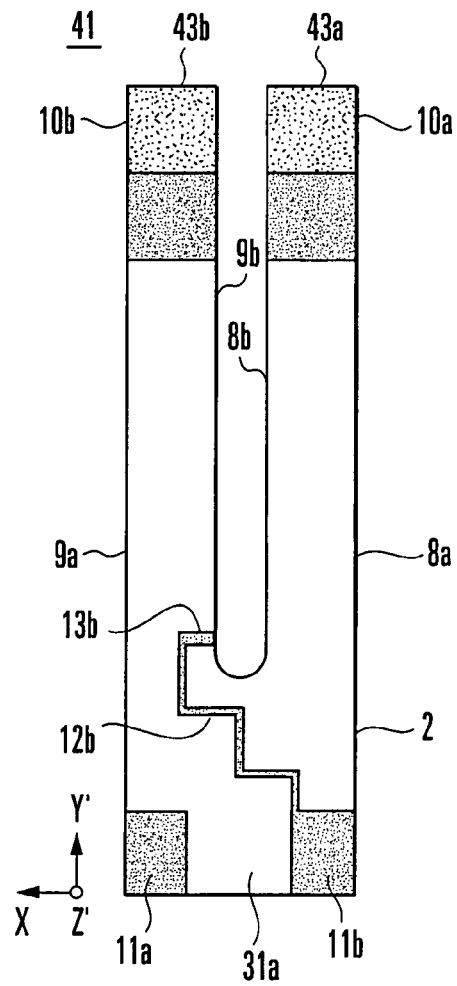
FIG. 7A  FIG. 7B
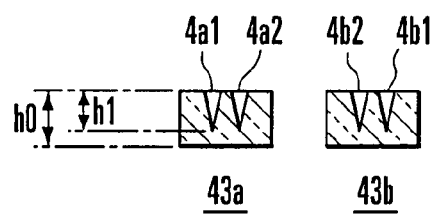
FIG. 7C

TUNING FORK CRYSTAL OSCILLATION PLATE AND METHOD OF MANUFACTURING THE SAME

BACKGROUND OF THE INVENTION

The present invention relates to a tuning fork crystal oscillation plate and a method of manufacturing the same.

A crystal oscillator incorporating a tuning fork crystal oscillation plate as one of electronic components is mounted and used as a reference signal source or clock signal source in an electronic device such as a computer, portable telephone, or a compact information device. Strong demands for downsizing, lower profile, and cost reduction have been conventionally imposed on the crystal oscillator.

The arrangement of a conventional tuning fork crystal oscillation plate will be described with reference to FIGS. 9 and 10.

In a conventional tuning fork crystal oscillation plate 101, various types of electrodes, e.g., oscillation electrodes, frequency adjustment electrodes, and external connection electrodes to electrically connect to a packaging container are formed on the surface of a crystal oscillation piece 101a having an tuning fork-like outer shape. The tuning fork crystal oscillation plate 101 is fabricated by photolithography, chemical etching, or the like.

The tuning fork crystal oscillation piece 101a comprises a base 102, and first and second oscillation arms 103a and 103b extending in the same direction from one side of the base 102.

The first oscillation arm 103a has grooves 104a and 104c in its front and rear main surfaces, respectively. The second oscillation arm 103b has grooves 104b and 104d in its front and rear main surfaces, respectively. The grooves 104a and 104c of the same oscillation arm 103a, or the grooves 104b and 104d of the same oscillation arm 103b are generally formed at opposing positions. The tuning fork crystal oscillation piece 101a has a thickness of 100 μm, and each of the grooves 104a to 104d has a depth of about 30 μm.

The groove 104a formed in the front main surface of the first oscillation arm 103a has a first front main surface electrode 106a on its inner surface, and the groove 104c formed in the rear main surface of the oscillation arm 103a has a first rear main surface electrode 107a on its inner surface. The first oscillation arm 103a has first side surface electrodes 108a and 108b on its two side surfaces.

The groove 104b formed in the front main surface of the second oscillation arm 103b has a second front main surface electrode 106b on its inner surface, and the groove 104d formed in the rear main surface of the oscillation arm 103b has a second rear main surface electrode 107b on its inner surface. The second oscillation arm 103b has second side surface electrodes 109a and 109b on its two side surfaces.

The front main surface electrode 106a and rear main surface electrode 107a of the first oscillation arm 103a, and the side surface electrodes 109a and 109b of the second oscillation arm 103b are electrically connected to each other and lead to an external connection electrode 111a through a connection electrode 112a to provide one terminal.

The front main surface electrode 106b and rear main surface electrode 107b of the second oscillation arm 103b, and the side surface electrodes 108a and 108b of the first oscillation arm 103a are electrically connected to each other through a connection electrode 112b and lead to an external connection electrode 111b to provide the other terminal. Hence, the tuning fork crystal oscillation plate 101 has a two-terminal arrangement.

An alternating voltage is applied between the two terminals. In a momentary state shown in FIG. 10, the side surface electrodes 108a and 108b of the first oscillation arm 103a are set at a + (positive) potential, and the front main surface electrode 106a and rear main surface electrode 107a of the same are set at a − (negative) potential. An electrical field is generated from + to −. These polarities are reversed in the second oscillation arm 103b. These electrical fields generate expansion and contraction in the oscillation arms 103a and 103b made of a crystal material to flex them.

A conventional method of manufacturing a tuning fork crystal oscillation plate will be described with reference to FIGS. 11A to 11F. FIGS. 11A to 11F show a series of steps of forming the conventional tuning fork crystal oscillation plate 101 shown in FIGS. 9 and 10 by means of formation of the outer shape of the tuning fork crystal oscillation piece 101a and the grooves 104a to 104d, and pattern formation of the electrodes 106a, 106b, 107a, 107b, 108a, 108b, 109a, and 109b.

First, a two-layer film consisting of a Cr film 151 and Au film 152 is formed as a corrosion-resistant film on each of the front and rear main surfaces of a crystal substrate 150 having a thickness of 100 μm. After applying a photosensitive resist film on each corrosion-resistant film, the crystal substrate 150 undergoes exposure and development which are necessary for formation of the outer shapes of a plurality of tuning fork crystal oscillation pieces 101a, to obtain each outer shape pattern 153 formed of the photosensitive resist film (FIG. 11A). As the photosensitive resist film, a positive film is used.

The exposed Au films 152 and Cr films 151 on which the outer shape patterns 153 do not exist are sequentially chemically etched. Hence, the crystal substrate 150 is exposed in the regions at the boundaries of the tuning fork crystal oscillation pieces 101a.

The photosensitive resist films that form the outer shape patterns 153 are not removed as they are not exposed. Then, the outer shape patterns 153 are exposed and developed with groove-shape patterns to obtain outer shape patterns 153a having openings corresponding to the groove portions. The exposed portions of the Au films 152 are chemically etched to obtain Au films 152a having openings corresponding to the groove portions. This exposes the surfaces of Cr films 151a corresponding to the groove portions (FIG. 11B). The chemical etching takes place in an atmosphere that does not expose the photosensitive resist films.

The crystal substrate 150 is dipped in a liquid mixture of hydrofluoric acid and ammonium fluoride to etch its exposed portions, thus obtaining the outer shapes of the plurality of tuning fork crystal oscillation pieces 101a. With this step, in the crystal substrate 150, an outer frame supports the plurality of tuning fork crystal oscillation pieces 101a with a support beam. In this step, etching is stopped before each tuning fork crystal oscillation piece 101a reaches a desired shape.

After that, the Cr films 151a are etched using the photosensitive resist films 153a and Au films 152a as masks. Hence, Cr films 151b having openings corresponding to the groove portions are obtained, and the surface portions of the crystal substrate 150 corresponding to the openings are exposed (FIG. 11C).

When etching the crystal substrate 150 again by dipping it in the liquid mixture of hydrofluoric acid and ammonium fluoride, grooves 104a to 104d are formed in each tuning fork crystal oscillation piece 101a, and the outer shape of each tuning fork crystal oscillation piece 101a is completely etched into a desired shape. Each of the grooves 104a to 104d has a depth of approximately 30 μm to 40 μm.

The photosensitive resist films 153a, Au films 152a, and Cr films 151b are sequentially removed. Except for the outer frame and support beam, only the tuning fork crystal oscillation pieces 101a remain. The grooves 104a to 104d are formed in two oscillation arms 103a and 103b of each tuning fork crystal oscillation piece 101a (FIG. 11D).

A metal film 154 to be used as electrodes is formed on the entire surface of each tuning fork crystal oscillation piece 101a including the inner portions of the grooves 104a to 104d. As the metal film 154, generally, a two-layer film of Cr and Au, an aluminum film, or the like is used, and formed by sputtering or vacuum deposition. Assume that a two-layer film of Cr and Au is employed in this case. The total thickness of the two layers is about 100 mm.

A photosensitive resist film 155 is formed on the entire surface of the metal film 154 of the tuning fork crystal oscillation piece 101a (FIG. 11E) by coating. An electrodeposition resist is used for three-dimensional coating of the photosensitive resist film 155.

To obtain the shapes of the various types of electrodes shown in FIGS. 9 and 10, exposure and development required for patterning the photosensitive resist film 155 are performed. During the exposure, if the mask of the exposure apparatus comes into contact with the crystal substrate 150, the tuning fork crystal oscillation piece 101a may undesirably drop from the crystal substrate 150 due to the resultant impact. For this reason, a non-contact double-sided projection exposure apparatus is used as the exposure apparatus.

The metal film 154 is etched using the remaining photosensitive resist film as a mask, and thereafter the photosensitive resist film is removed. Thus, various types of electrodes including front main surface electrodes 106a and 106b, rear main surface electrodes 107a and 107b, and side surface electrodes 108a, 108b, 109a, and 109b are obtained, and the outer shape of the tuning fork crystal oscillation plate 101 in which the various types of electrodes are formed on the surface of the tuning fork crystal oscillation piece 101a is completed (FIG. 11F).

After that, metal films 110a and 110b formed at the distal ends of the oscillation arms 103a and 103b are increased or decreased to adjust the oscillation frequency. To form the metal films 110a and 110b, Au or Ag is used. Trimming of the metal films 110a and 110b employs a laser method or ion etching method. Frequency adjustment is performed after packaging the tuning fork crystal oscillation plate 101 in a container, or after packaging the tuning fork crystal oscillation plate 101 in a container and sealing a tuning fork crystal oscillation plate packaging space with a lid.

Reference 1 (U.S. Pat. No. 3,969,641), reference 2 (Japanese Patent Laid-Open No. 52-61985), reference 3 (Japanese Patent Laid-Open No. 56-65517), reference 4 (WO00/44092), reference 5 (Japanese Patent No. 3,729,249), reference 6 (Japanese Patent Laid-Open No. 2004-159072), and the like disclose the conventional tuning fork crystal oscillation plate 101 as described above and its manufacturing method.

The conventional tuning fork crystal oscillation plate 101 and its manufacturing method have the following problems.

(1) In the conventional tuning fork crystal oscillation plate 101, the grooves 104a and 104c are formed in the front and rear surfaces of the oscillation arm 103a to oppose each other, and the grooves 104b and 104d are formed in the front and rear surfaces of the oscillation arm 103b to oppose each other. Thus, with the conventional manufacturing method, variations occur in the outer shapes of the tuning fork crystal oscillation pieces 101a and the shapes of the grooves 104a to 104d, in the forming positions of the grooves 104a to 104d, depending on the alignment accuracy of the front and rear main surfaces of the crystal substrate 150 of the exposure apparatus, and in the depths of the front grooves 104a and 104b and the rear grooves 104c and 104d due to etching from the front and rear sides. These variations appear as variations in frequency among the respective tuning fork crystal oscillation plates 101. More specifically, the frequency may largely differ between, of the plurality of tuning fork crystal oscillation plates 101 formed from one crystal substrate 150, one obtained from the central portion of the crystal substrate 150 and one obtained from near the peripheral portion of the crystal substrate 150. Also, variations in frequency may increase among crystal substrate lots. More specifically, when compared to a tuning fork crystal oscillation plate having no grooves 104a to 104d, the variations in frequency were three times. When the variations in frequency increase among the tuning fork crystal oscillation plates 101 in this manner, the frequency adjustment amount by using the metal films 110a and 110b in the tuning fork crystal oscillation plate 101 undesirably becomes very large.

(2) If an error occurs in the shapes of the grooves 104a to 104d, e.g., if a shift occurs between the forming positions of the front grooves 104a and 104b of the oscillation arm 103a and the rear grooves 104c and 104d of the oscillation arm 103b, an oscillation frequency differs between the two oscillation arms 103a and 103b, leading to an imbalance. In this case, leaking oscillation is conducted to the base 102. Consequently, a crystal impedance (to be referred to as CI hereinafter) value becomes large and unstable.

One of factors that cause these two problems is as follows. In a general double-sided projection exposure apparatus used for the manufacture of the conventional tuning fork crystal oscillation plate 101, the alignment accuracy of the front and rear surfaces is about several μm, and the resolution is on the 5-μm level. With the conventional manufacturing method, the outer shape of the tuning fork crystal oscillation piece 101a and the grooves 104a to 104d must be formed by two separate exposure operations. If the accuracy error of the exposure apparatus for each exposure is worst, it leads to the accuracy variations of several μm×2. These variations appear not only as vertical and horizontal shift but also as shift in the rotational direction. Added with exposure to form electrodes, exposure must be performed three times, leading to further large variations in positional accuracy.

The double-sided projection exposure apparatus is comparatively expensive. With the conventional manufacturing method, the yield is low to increase the manufacturing cost.

With the conventional manufacturing method, exposure must be performed three times, as described above, leading to a large number of steps.

Another problem of the conventional manufacturing method will be described with reference to FIGS. 12A to 12C. In the step described in FIG. 11C of etching the Cr films 151a, the presence of the Au films 152a on the Cr films 151a causes cell corrosion. The Cr films 151 are etched within a shorter period of time (more specifically, within several ten sec) when compared to a case wherein no Au films 152a are present, and the etching amounts of the Cr films 151 are also difficult to control. Therefore, in practice, side etching increases as shown in FIG. 12A, and the Cr film patterns 151c become thinner than desired pattern shapes. This problem leads to large differences among the crystal substrates 150. When etching the crystal substrate 150 using the thin patterns 151c, steps 156 are formed on the two sides of each of the oscillation arms 103a and 103b, as shown in FIG. 12B. As the Cr films 151 are etched a total of two times, i.e., the step of FIG. 11B and the step of FIG. 11C, the shape variations in Cr film patterns 151c and in oscillation arms 103a and 103b become large. The section of a finished product including these influences is as shown in FIG. 12C, and may not be as shown in FIG. 11F. In FIGS. 12B and 12C, reference numerals 101a', 104a' and 104c', 106a', 107a', and 108a' and 108b' respectively denote a modified tuning fork crystal oscillation piece, modified grooves, a modified front main surface electrode, a modified rear main surface electrode, and modified side surface electrodes, respectively.

SUMMARY OF THE INVENTION

The present invention has been made to solve these problems, and has as its object to decrease the CI value of a crystal oscillator mounted with a very compact tuning fork crystal oscillation plate.

It is another object of the present invention to decrease variations in resonant frequency of the tuning fork crystal oscillation plates in one crystal substrate or among different crystal substrates.

It is still another object of the present invention to decrease the number of steps in manufacturing a tuning fork crystal oscillation plate.

It is still another object of the present invention to realize manufacture of a tuning fork crystal oscillation plate with an inexpensive facility.

In order to achieve the above objects of the present invention, there is provided a tuning fork crystal oscillation plate comprising a tuning fork crystal oscillation piece including a base with a substantially rectangular shape when seen from the top, and at least two oscillation arms extending in the same direction from one side of the base and having substantially rectangular shapes when seen from the top, the at least two oscillation arms including first and second oscillation arms, first and second grooves which are formed in one main surface of the first oscillation arm and one main surface of the second oscillation arm on the same side, the first groove and the second groove extending from a boundary line of the base with the first and second oscillation arms toward distal ends of the first oscillation arm and the second oscillation arm, the first groove and the second groove having a length that falls within a range of 50% (inclusive) to 70% (exclusive) a length of the first oscillation arm and the second oscillation arm, and the first groove and the second groove having a depth that falls within a range of 50% to 90% (both inclusive) a thickness of the tuning fork crystal oscillation piece, first and second groove electrodes which are formed on inner surfaces of the first and second grooves, respectively, first side surface electrodes which are formed on two side surfaces, respectively, of the first oscillation arm, and second side surface electrodes which are formed on two side surfaces, respectively, of the second oscillation arm, wherein the first groove electrode is connected to the second side surface electrodes to constitute one terminal, and the second groove electrode is connected to the first side surface electrodes to constitute the other terminal.

In order to achieve the above objects of the present invention, there is also provided a method of manufacturing a tuning fork crystal oscillation plate, characterized by comprising the steps of forming corrosion-resistant films respectively on a front main surface and a rear main surface of a crystal substrate, forming first resist films, each having a shape corresponding to a plurality of tuning fork crystal oscillation pieces, on the respective corrosion-resistant films on the two main surfaces of the crystal substrate at opposing positions, each of the tuning fork crystal oscillation pieces having a shape obtained by combining a first rectangular portion with second and third rectangular portions which extend in the same direction from one side of the first rectangular portion, only the first resist film formed on one main surface of the crystal substrate including a resist opening, the resist opening extending from a boundary line of the first rectangular portion with the second rectangular portion and the third rectangular portion toward a distal end of the second rectangular portion and a distal end of the third rectangular portion, and the resist opening including a length that falls within a range of 50% (inclusive) to 70% (exclusive) a length of each of the second rectangular portion and the third rectangular portion, removing, by etching, portions where the first resist films are not present and surfaces of the corrosion-resistant films are exposed, removing the first resist films, forming second resist films on the corrosion-resistant film remaining on one main surface of the crystal substrate, and on a region that opposes, among the corrosion-resistant film remaining on the other main surface of the crystal substrate, at least the corrosion-resistant film remaining on one main surface of the crystal substrate, etching exposed portions of the crystal substrate where the second resist films are formed and which are not covered with the corrosion-resistant films, from a front side and a rear side, to form a plurality of tuning fork crystal oscillation pieces, each comprising a groove in only one main surface, the groove including a depth that falls within a range of 50% to 90% (both inclusive) a thickness of the tuning fork crystal oscillation piece, removing, by etching, portions where the second resist films are not formed and surfaces of the corrosion-resistant films are exposed, forming a metal film on a surface of the tuning fork crystal oscillation piece, removing a portion of the metal film formed on the second resist film, together with the second resist film, to form an electrode formed of a remaining portion of the metal film, and removing the corrosion-resistant films from the tuning fork crystal oscillation piece on which the electrode is formed.

BRIEF DESCRIPTION OF THE DRAWINGS

FIG. 1A is a plan view showing the front surface of a tuning fork crystal oscillation plate according to the first embodiment of the present invention;

FIG. 1B is a plan view showing the rear surface of the tuning fork crystal oscillation plate shown in FIG. 1A;

FIG. 2 is a sectional view, taken along the virtual cutting line II-II' in FIG. 1A, of the tuning fork crystal oscillation plate according to the first embodiment of the present invention;

FIG. 4A is a plan view showing the front surface of a tuning fork crystal oscillation plate according to the second embodiment of the present invention;

FIG. 4B is a plan view showing the rear surface of the tuning fork crystal oscillation plate shown in FIG. 4A;

FIG. 5 is a sectional view, taken along the virtual cutting line V-V' in FIG. 4A, of the tuning fork crystal oscillation plate according to the second embodiment of the present invention;

FIG. 6A is a plan view showing the front surface of a tuning fork crystal oscillation plate according to the third embodiment of the present invention;

FIG. 6B is a plan view showing the rear surface of the tuning fork crystal oscillation plate shown in FIG. 6A;

FIG. 6C is a sectional view, taken along the virtual cutting line VIC-VIC' in FIG. 6A, of the tuning fork crystal oscillation plate shown in FIG. 6A;

FIGS. 7A to 7C are views showing a modification of the tuning fork crystal oscillation plate shown in FIGS. 6A to 6C, in which FIG. 7A is a plan view showing the front surface of the tuning fork crystal oscillation plate, FIG. 7B is a plan view showing the rear surface of the tuning fork crystal oscillation plate, and FIG. 7C is a sectional view of the tuning fork crystal oscillation plate taken along the virtual cutting line VIIC-VIIC' in FIG. 7A;

DESCRIPTION OF THE PREFERRED EMBODIMENTS

Figure 3:
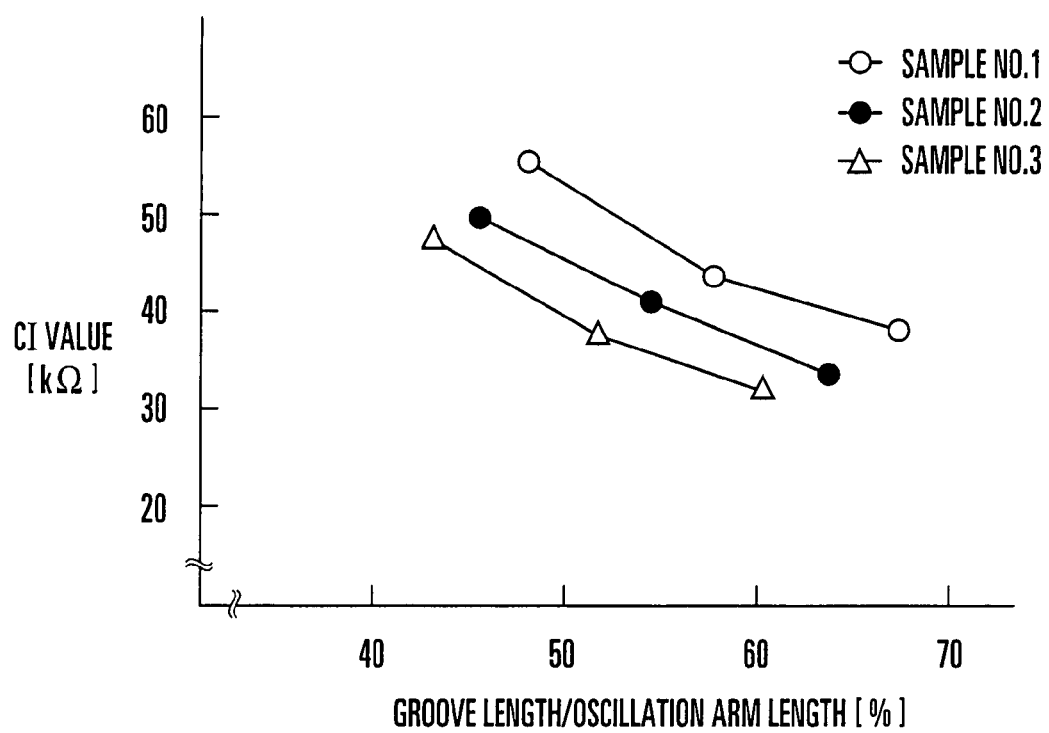
FIG. 3 is a graph showing the characteristics as a relationship between the ratio of the groove length to the oscillation arm length and CI values in the tuning fork crystal oscillation plate according to the first embodiment of the present invention.

The embodiments of the present invention will be described in detail with reference to the accompanying drawings. A description will be made on a tuning fork crystal oscillation plate having a resonant frequency of 32.768 kHz. In the drawings, the same reference numerals denote the same members. Part of the structure is not illustrated for the sake of clear description. Some of the sizes of the illustrated structure are exaggerated.

First Embodiment

As shown in FIGS. 1A and 1B, a tuning fork crystal oscillation plate 1 according to the first embodiment of the present invention has a plurality of electrodes 6a, 6b, 7a, 7b, 8a, 8b, 9a, and 9b formed on the surface of a tuning fork crystal oscillation piece 1a made from a flat crystal plate.

The crystal plate that forms the tuning fork crystal oscillation piece 1a is obtained by cutting a crystal along a plane obtained by rotating a plane, comprising an X-axis (electrical axis) and a Y-axis (mechanical axis) of the crystal, through −10° to +10° about the X-axis as the center. The angle through which the plane is rotated will be called a cut angle θ. When cutting the crystal at the cut angle θ, although the crystallographic axis in the widthwise direction of the tuning fork crystal oscillation piece 1a is identical with the X-axis of the crystal, a crystallographic axis Y' in the longitudinal direction of the tuning fork crystal oscillation piece 1a is the one obtained by rotating the Y-axis of the crystal through θ° about the Y-axis as the center, and a crystallographic axis Z' in the direction of thickness of the tuning fork crystal oscillation piece 1a is the one obtained by rotating the Z-axis (optical axis) of the crystal through θ° about the X-axis as the center.

The tuning fork crystal oscillation piece 1a comprises a base 2 having an almost rectangular shape when seen from the top, and first and second oscillation arms 3a and 3b extending in the same direction (Y' direction) from one side of the base 2 and having almost rectangular shapes when seen from the top.

Examples of the sizes of the tuning fork crystal oscillation piece 1a will be described. A thickness h0 of the tuning fork crystal oscillation piece 1a is 100 μm except for the portions of grooves 4a and 4b to be described later. The length in the Y' direction of the base 2 is 560 μm. A length L0 in the Y' direction of each of the oscillation arms 3a and 3b, that is, the lengths from the connection boundary line of each of the oscillation arms 3a and 3b with the base 2 to the distal end (free end) of the corresponding one of the oscillation arms 3a and 3b, is 1,100 μm. Accordingly, the entire length of the tuning fork crystal oscillation piece 1a is 1,660 μm. The width of each of the oscillation arms 3a and 3b is 123 μm, and the gap width between the first and second oscillation arms 3a and 3b is 82 μm.

The first and second oscillation arms 3a and 3b respectively have the first and second grooves 4a and 4b in their front main surfaces. The respective grooves 4a and 4b extend from the connection boundary lines of the oscillation arms 3a and 3b with the base 2 toward the distal ends of the oscillation arms 3a and 3b. In this example, each of the grooves 4a and 4b has a width of 93 μm, and a length L1 of 700 μm in the Y' direction (in this case, the length of each of the grooves 4a and 4b is about 63.3% the length of the corresponding one of the oscillation arms 3a and 3b). According to this embodiment, a bank 5 between the open end of each of the grooves 4a and 4b and the side surface end in the lengthwise direction of the corresponding one of the oscillation arms 3a and 3b has a width of 15 μm. The bank 5 is preferably formed with a width falling within a range of 2 μm to 20 μm.

As shown in FIG. 2, due to chemical etching from the front main surfaces, the sectional shapes of the grooves 4a and 4b (sectional shapes in a direction perpendicular to the longitudinal direction of the grooves 4a and 4b) are inverse trapezoids (each with an upper width larger than the lower width), and have taper angles in the direction of depth. A depth h1 of each of the grooves 4a and 4b to the corresponding bottom surface is 80 μm. As the thickness h0 of the tuning fork crystal oscillation piece 1a including the oscillation arms 3a and 3b is 100 μm, h1 is 80% of h0.

According to this embodiment, the grooves 4a and 4b are formed in the front main surfaces of the oscillation arms 3a and 3b, respectively. Alternatively, the grooves 4a and 4b may be formed in the rear main surfaces of the oscillation arms 3a and 3b, respectively. That is, it suffices as far as the grooves 4a and 4b are formed in the oscillation arms 3a and 3b each on one main surface on the same side, that is, on only one surface.

The grooves 4a and 4b of the oscillation arms 3a and 3b respectively have first and second groove electrodes 6a and 6b on their inner surfaces. The oscillation arms 3a and 3b have first and second flat electrodes 7a and 7b at those positions on their rear main surfaces which oppose the groove electrodes 6a and 6b. The oscillation arm 3a has first side surface electrodes 8a and 8b on its two side surfaces. The oscillation arm 3b has second side surface electrodes 9a and 9b on its two side surfaces. The two oscillation arms 3a and 3b have, in the vicinity of their fork, first and second bands 13a and 13b which respectively, electrically connect the electrodes 6a and 7a of the oscillation arm 3a via the side surface of the oscillation arm 3a, and the groove electrodes 6b and 7b of the oscillation arm 3b via the side surface of the oscillation arm 3b. The oscillation arms 3a and 3b respectively have, on the rear main surfaces of their distal ends (within a range of 30% in length ratio from the distal end faces), first and second frequency adjustment electrodes (distal end electrodes) 10a and 10b used for oscillation frequency adjustment. To form the frequency adjustment electrodes 10a and 10b, any one material of Au, Ag, and Pd can be employed.

The groove electrode 6a and flat electrode 7a of the first oscillation arm 3a, and the side surface electrodes 9a and 9b and frequency adjustment electrode 10b of the second oscillation arm 3b are electrically connected to a first external connection electrode terminal 11a through a first connection electrode 12a formed on the front main surface of the tuning fork crystal oscillation piece 1a, to provide one terminal. The groove electrode 6b and flat electrode 7b of the second oscillation arm 3b, and the side surface electrodes 8a and 8b and frequency adjustment electrode 10b of the first oscillation arm 3a are electrically connected to a second external connection electrode terminal 11b via a second connection electrode 12b formed on the rear main surface of the tuning fork crystal oscillation piece 1a, to provide the other terminal. Hence, the tuning fork crystal oscillation plate 1 has a two-terminal arrangement.

When applying an alternating voltage between the two external connection electrode terminals 11a and 11b of the tuning fork crystal oscillation plate 1, it momentarily generates electrical fields as indicated by arrows in FIG. 2. For example, the electrical fields generated perpendicularly from the side surface electrodes 8a and 8b of the first oscillation arm 3a are perpendicularly drawn by the taper surfaces of the groove electrode 6a on the sides of the side surface electrodes 8a and 8b, respectively. Since the second oscillation arm 3b has an opposite polarity, the electrical fields generated perpendicularly from the taper surfaces of the groove electrode 6b of the second oscillation arm 3b on the sides of the side surface electrodes 9a and 9b, respectively, are perpendicularly drawn by the side surface electrodes 9a and 9b. In this manner, between the oscillation arms 3a and 3b, the direction of the electrical field between the groove electrode and side surface electrode differs. Similarly, the direction of the electrical field between the flat electrode and side surface electrode differs between the oscillation arms 3a and 3b. The electrical fields expand and contract the oscillation arms 3a and 3b. As the direction of the electrical field differs between the oscillation arms 3a and 3b, the oscillation arms 3a and 3b will flex in opposite directions. Application of an alternating voltage flexes the oscillation arms 3a and 3b.

Experiments on the tuning fork crystal oscillation plate 1 according to this embodiment will be described. First, in addition to the sample (No. 1) of the tuning fork crystal oscillation plate 1 with the sizes described above, two types of samples (Nos. 2 and 3) each having oscillation arms 3a and 3b with a different length L0 were prepared. Each sample was prepared in one in which the grooves 4a and 4b have the length L1 as described above, and ones in each of which the grooves 4a and 4b have a different length L1, leading to a total of 3 pieces for each sample. The CI values of the respective samples were measured. FIG. 3 shows the thus-obtained characteristics, that is, the characteristics as a relationship between the ratio [%] of the length L1 of the grooves 4a and 4b to the length L0 of the oscillation arms 3a and 3b, and the CI values [kΩ]. From FIG. 3, in any sample in which the oscillation arms 3a and 3b have the different length L0, when the ratio of the length L1 of the grooves 4a and 4b to the length L0 of the oscillation arms 3a and 3b becomes 50% or less, the grooves 4a and 4b become no longer effective, and the CI value increases.

Considering formation of the frequency adjustment electrodes 10a and 10b at the distal ends (within a length range of 30% from the distal end surfaces) of the oscillation arms 3a and 3b, the ratio of the length L1 of the grooves 4a and 4b to the length L0 of the oscillation arms 3a and 3b preferably falls within a range of 50% (inclusive) to 90% (exclusive).

Also, the ratio of the depth h1 of the grooves 4a and 4b to the thickness h0 of the tuning fork crystal oscillation piece 1a preferably falls within a range of 50% to 90% (both inclusive).

When the ratio (obtained from the graph of FIG. 3) of the length of the grooves 4a and 4b to the length of the oscillation arms 3a and 3b, and the ratio of the depth of the grooves 4a and 4b to the thickness of the oscillation arms 3a and 3b both exceed 50%, the CI value of the tuning fork crystal oscillation plate 1 decreases sharply. Hence, when a crystal oscillator was formed by packaging the tuning fork crystal oscillation plate 1 in a 3.2 mm (length)×1.5 mm (width)×0.7 mm (thickness) box-like container and hermetically sealing the container in a vacuum, the CI value of this crystal oscillator was as very good as 45 kΩ or less. This CI value is equal to or more than that of the conventional product in which the oscillation arm 103 has the grooves 104 and 104c in its front and rear main surfaces and the oscillation arm 103b has the grooves 104b and 104d in its front and rear main surfaces.

When the length ratio and depth ratio of each of the grooves 4a and 4b were 50% or less, the CI value of the crystal oscillator was 50 kΩ or more. When, however, the length ratio and depth ratio exceed 50% which is the median of each of the length and thickness of the oscillation arms 3a and 3b, the CI value of the crystal oscillator decreases sharply. If the length ratio is approximately 60% and the depth ratio is 80%, the CI value is about 35 kΩ. Therefore, a crystal oscillator fabricated using the tuning fork crystal oscillation plate 1 of this embodiment largely contributes to the reduction in current consumption of a compact portable device such as a portable telephone or radio clock.

When downsizing the outer shape of the tuning fork crystal oscillation plate, the CI value tends to increase. Considering the oscillation start-up margin of an oscillation circuit to which a crystal oscillator mounted with the tuning fork crystal oscillation plate is connected, the ideal CI value is approximately 45 kΩ or less. If the CI value is 50 kΩ, the start-up performance of the oscillation circuit is poor to cause an oscillation failure with a high probability. Therefore, this embodiment provides a large effect.

Second Embodiment

As shown in FIGS. 4A, 4B, and 5, a tuning fork crystal oscillation plate 21 according to the second embodiment of the present invention is obtained by removing the flat electrode 7a and 7b from the rear main surfaces of the two oscillation arms 3a and 3b of the tuning fork crystal oscillation plate 1 of the first embodiment. Since no electrodes 7a and 7b are present, the bands 13a and 13b that connect the flat electrodes 7a and 7b to the groove electrodes 6a and 6b in the first embodiment are not formed in the second embodiment. Frequency adjustment electrodes 10a and 10b, external connection electrode terminals 11a and 11b, and a connection electrode 12b are formed on the rear main surface of a tuning fork crystal oscillation piece 1a.

Except for this, the arrangement of the second embodiment is the same as that of the first embodiment.

This arrangement can also provide the same operation and effect as those of the first embodiment.

In general, to form the frequency adjustment electrodes 10a and 10b, when a plurality of tuning fork crystal oscillation plates 21 are connected to a crystal substrate, the frequency is detected while oscillating the tuning fork crystal oscillation plates 21 by frequency adjustment. Alternatively, metal films formed at the distal ends of oscillation arms 23a and 23b are removed by a laser method or ion etching method using measurement data obtained in advance, until a target frequency is obtained. At this time, Au, Ag, or Pd that constitutes the metal films may scatter to short-circuit the electrodes, or increase the sheet resistance. According to this embodiment, however, the frequency adjustment electrodes 10a and 10b are formed on the rear main surface having no flat electrodes 7a and 7b, to greatly reduce occurrence of the above problems.

Third Embodiment

A tuning fork crystal oscillation plate 31 according to the third embodiment of the present invention shown in FIGS. 6A to 6C is different from the tuning fork crystal oscillation plate 1 of the first embodiment in the groove structure of the two oscillation arms.

An oscillation arm 33a of a tuning fork crystal oscillation piece 31a of the tuning fork crystal oscillation plate 31 has two grooves 4a1 and 4a2, in its front main surface, to extend parallel to each other in the longitudinal direction of the oscillation arm 33a. The sections of the grooves 4a1 and 4a2 (the sections in a direction perpendicular to the longitudinal direction of the grooves 4a1 and 4a2) have almost V shapes. In the same manner as in the first embodiment, the ratio of a length L1 of the grooves 4a1 and 4a2 to a length L0 of the oscillation arm 33a falls within a range of 50% (inclusive) to 70% (exclusive). A ratio of a depth h1 of the grooves 4a1 and 4a2 to a thickness h0 of the oscillation arm 33a falls within a range of 50% to 90% (both inclusive).

An oscillation arm 33b also has two grooves 4b1 and 4b2, similar to the grooves 4a1 and 4a2, in its front main surface.

FIGS. 7A to 7C show a turning fork crystal oscillation plate 41 as a modification of the tuning fork crystal oscillation plate 31. The turning fork crystal oscillation plate 41 has grooves 4a1, 4a2, 4b1, and 4b2, but has no flat electrodes 7a and 7b on the rear main surfaces of its oscillation arms 43a and 43b, in the same manner as in the second embodiment.

The above tuning fork crystal oscillation plates 31 and 41 can provide almost the same performance as that of the first embodiment.

In this embodiment, each of the oscillation arms 33a and 33b has two grooves. Alternatively, each oscillation arm may have three or more grooves.

Fourth Embodiment

A method of manufacturing the tuning fork crystal oscillation plate 1 according to the first embodiment of the embodiment will be described with reference to FIGS. 8A to 8J.

Figure 8A:
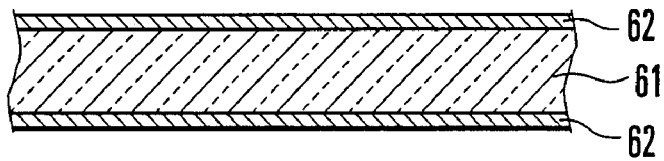
FIGS. 8A to 8J are sectional views showing major steps in manufacturing the tuning fork crystal oscillation plate shown in FIGS. 1A, 1B, and 2, and show the sections of the first and second oscillation arm portions.
Figure 8B:
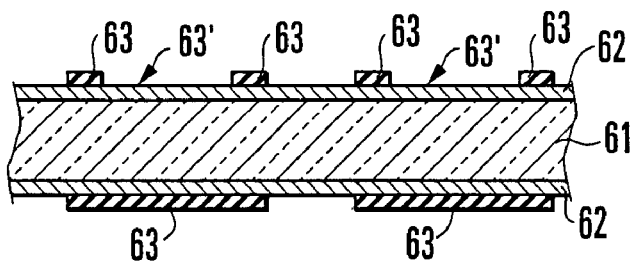

First, a crystal substrate 61 obtained by cutting a Z' plate at a cutting angle θ=−10° to +10° is prepared. As shown in FIG. 8A, corrosion-resistant films 62 are formed on the two, front and rear main surfaces of the crystal substrate 61 by sputtering. As the material of the corrosion-resistant films 62, any one of Cr, aluminum oxide, and a two-layer film consisting of a Cr film+Au film, can be used. In this case, assume that only Cr is to be used as the material of the corrosion-resistant films 62.

Positive (photodecomposable) first photosensitive resists are formed on the corrosion-resistant films 62 on the two main surfaces of the crystal substrate 61. After drying, the first photosensitive resists undergo exposure, development, and drying (to be referred to as "patterning" hereinafter) to form first resist films 63, having the shapes of a plurality of tuning fork crystal oscillation pieces 1a, at front and rear opposing positions. Namely, the resist films 63 form a shape obtained by combining the first rectangular portions corresponding to a base 2 of the tuning fork crystal oscillation piece 1a and the second and third rectangular portions respectively corresponding to oscillation arms 3a and 3b and extending in the same direction from one side of the first rectangular portion. Note that the front resist film 63 of the crystal substrate 61 has openings 63' at positions where grooves 4a and 4b are to be formed. In other words, the openings 63' extend from the boundary lines of the first rectangular portion with the second and third rectangular portions toward the distal ends of the second and third rectangular portions. The length of the openings 63' falls within a range of 50% (inclusive) to 70% (exclusive) the length of the second and third rectangular shapes.

Figure 8C:
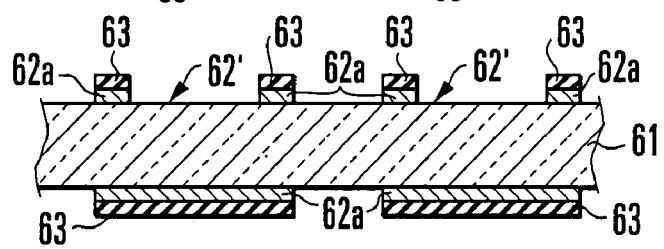

Cr at portions including the openings 63', where no resist films 63 are present and the surfaces of the corrosion-resistant films 62 are exposed is removed by etching. This removes portions corresponding to the boundaries of the plurality of tuning fork crystal oscillation pieces 1a and portions corresponding to the grooves 4a and 4b simultaneously to expose the surface of the crystal substrate 61. Hence, as shown in FIG. 8C, corrosion-resistant films 62a having the shape of the tuning fork crystal oscillation piece 1a remain on the two sides of the crystal substrate 61. Note that the front corrosion-resistant film 62a of the crystal substrate 61 has openings 62' at positions where the grooves 4a and 4b are to be formed. Hence, in this step, the formation patterns of the tuning fork shape and the grooves are to be fabricated simultaneously.

Figure 8D:
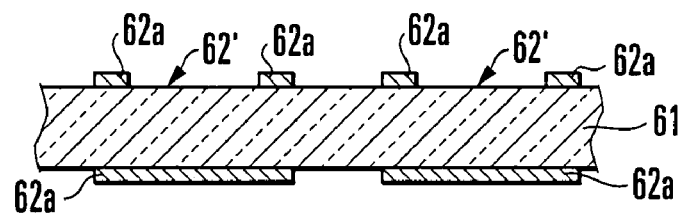

Then, the resist films 63 on the corrosion-resistant films 62a are removed, as shown in FIG. 8D.

Figure 8E:
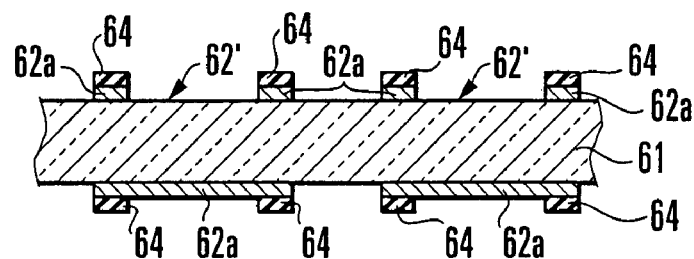

Positive second photosensitive resists are formed on the corrosion-resistant films 62a on the two main surfaces of the crystal substrate 61, and are patterned into shapes that are negative to the shapes of the respective types of electrodes 6a, 6b, 7a, 7b, 11a, 11b, 12a, 12b, 13a, and 13b shown in FIG. 1 to form second resist films 64 as shown in FIG. 8E. Namely, the resist films 64 form shapes with openings at positions corresponding to the respective types of electrodes described above. The photosensitive resists formed on the corrosion-resistant films 62a in this step are as comparatively thick as 2 μm to 3 μm.

Figure 8F:
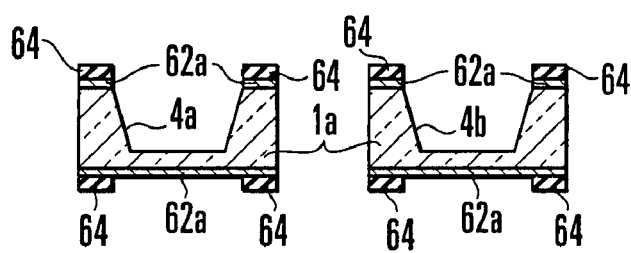

As the etchant, a liquid mixture of hydrofluoric acid and ammonium fluoride is prepared. The crystal substrate 61 having the corrosion-resistant films 62a and resist films 64 on its surfaces is dipped in the etchant to etch those exposed portions of the crystal substrate 61 which are not covered with the resist films 64. At this time, the boundary portions of the plurality of tuning fork crystal oscillation pieces 1a are etched from the two, front and rear sides of the crystal substrate 61, but portions corresponding to the grooves 4a and 4b are etched only from the front side. By stopping etching when the boundary portions are etched through but the portions corresponding to the grooves 4a and 4b are not etched through yet, the plurality of tuning fork crystal oscillation pieces 1a each having the grooves 4a and 4b only in the front main surface, as shown in FIG. 8F, are formed. At this time, the depth of the grooves 4a and 4b is set to fall within the range of 50% to 90% (both inclusive) the thickness of the tuning fork crystal oscillation piece 1a. With this step, in the crystal substrate 61, an outer frame supports the plurality of tuning fork crystal oscillation pieces 101a with a support beam.

Figure 8G:
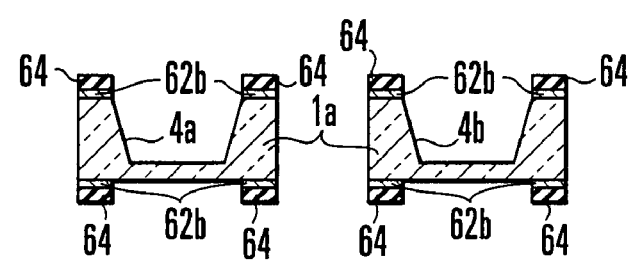

As shown in FIG. 8G, Cr at portions where no resist films 64 are present and the surfaces of the corrosion-resistant films 62a are exposed is removed by etching to expose the surface of the crystal substrate 61.

Figure 8H:
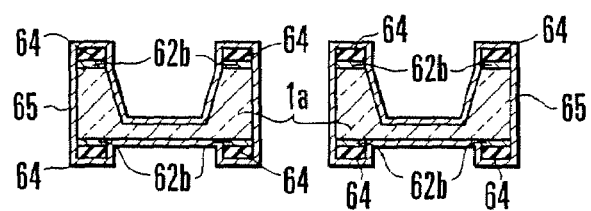

As shown in FIG. 8H, the surface of the tuning fork crystal oscillation piece 1a is covered with a metal film 65. As the metal film 65, one having an arrangement in which metal films are stacked, e.g., Ti+Pd, Ti+AuNi+Pd, Ni+Au, or the like, can be employed. Note that any other material can be used to form the metal film 65 as far as it does not dissolve in an etchant for corrosion-resistant films 62b made of Cr and it satisfies required electrical characteristics.

Figure 8I:
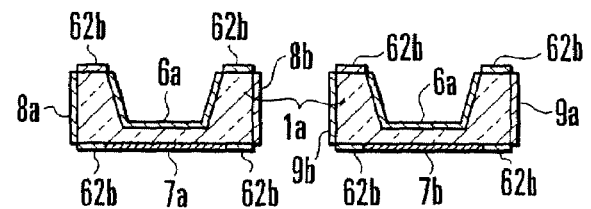

The tuning fork crystal oscillation piece 1a covered with the metal film 65 is dipped in a liquid that dissolves the resist films 64, and the metal film 65 formed on the resist films 64 is removed together with the resist films 64 formed on the two main surfaces of the tuning fork crystal oscillation piece 1a. As shown in FIG. 8I, respective types of electrodes 6a, 6b, 7a, 7b, 8a, 8b, 11a, 11b, 12a, 12b, 13a, and 13b are formed from the remaining metal films. The corrosion-resistant films 62b under the resist films 64 remain on the tuning fork crystal oscillation piece 1a.

Figure 8J:
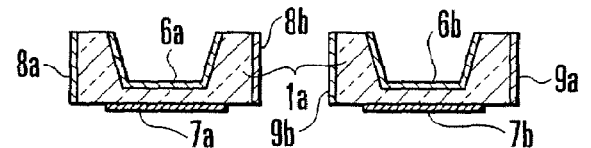
Figure 9:
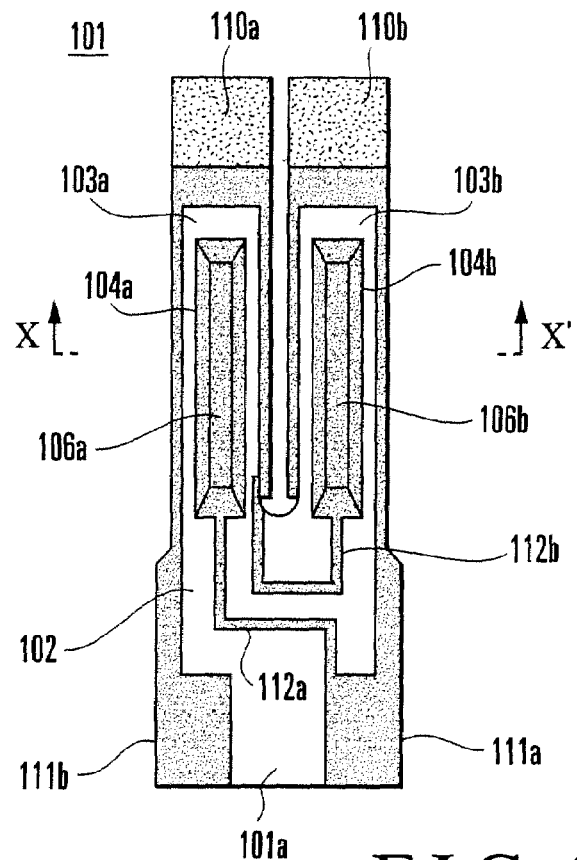
FIG. 9 is a plan view showing a conventional tuning fork crystal oscillation plate.
Figure 10:
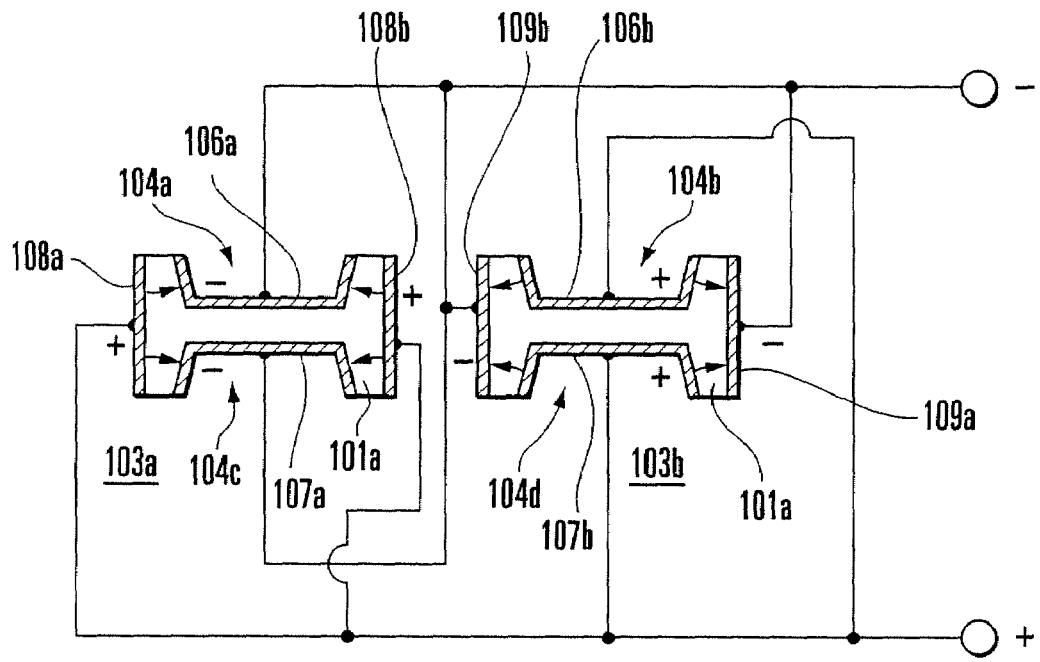
FIG. 10 is a sectional view taken along the virtual cutting line X-X' in FIG. 9 of the conventional tuning fork crystal oscillation plate.
Figure 11A:
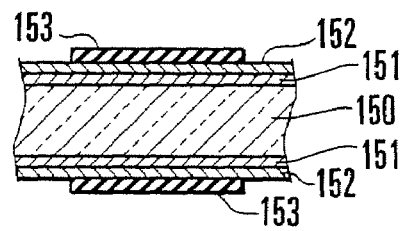
FIGS. 11A to 11F are sectional views showing major steps in manufacturing the tuning fork crystal oscillation plate shown in FIGS. 9 and 10, and show the sections of the first and second oscillation arm portions.
Figure 11B:
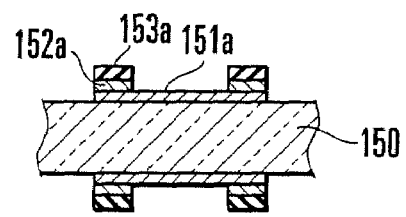
Figure 11C:
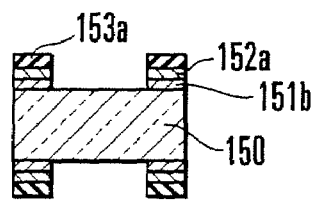
Figure 11D:
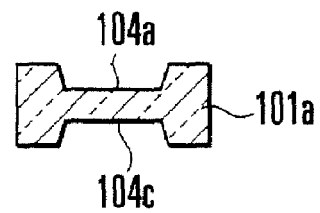
Figure 11E:
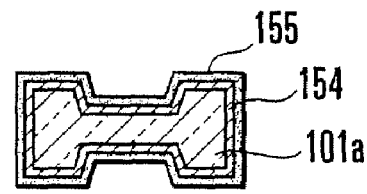
Figure 11F:
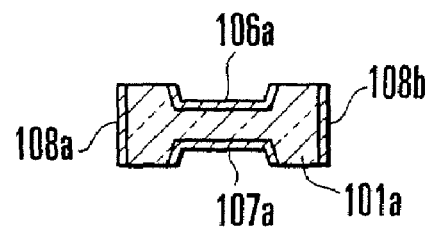
Figure 12A:
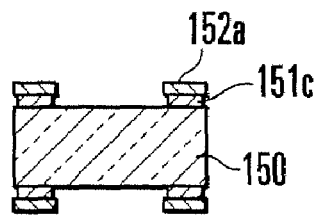
FIGS. 12A to 12C are sectional views to explain problems in a conventional method of manufacturing a tuning fork crystal oscillation plate.
Figure 12B:
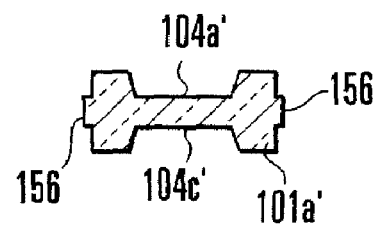
Figure 12C:
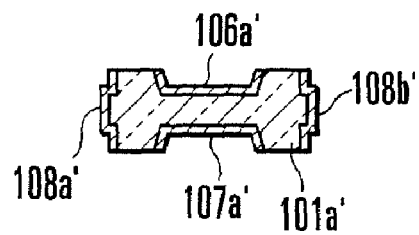

As shown in FIG. 8J, the tuning fork crystal oscillation piece 1a having the respective types of electrodes is dipped in the etchant for the corrosion-resistant films 62b made of Cr, to remove the corrosion-resistant films 62b remaining on the tuning fork crystal oscillation piece 1a by etching. The respective types of electrodes described above are not etched but remain as they do not dissolve in the etchant for the corrosion-resistant films 62b made of Cr. As the etchant for the corrosion-resistant films 62b made of Cr, for example, a liquid mixture of ceric ammonium nitrate and perchloric acid can be used. The plurality of tuning fork crystal oscillation plates 1 are thus finished.

The series of electrode pattern formation processes described in this embodiment employs lift-off.

If no flat electrodes 7a and 7b are to be formed on the rear main surfaces of the oscillation arms 23a and 23b, as in the tuning fork crystal oscillation plate 21 of the second embodiment, in the step shown in FIG. 8E, openings must be formed at positions corresponding to the flat electrodes 7a and 7b on the resist film 64 formed on the rear side of the crystal substrate 61.

In the manufacturing method of the tuning fork crystal oscillation plate 1 according to this embodiment, etching to form the outer shape of the tuning fork crystal oscillation piece 1a (tuning fork outer shape) and etching for the corrosion-resistant films 62 used to form the shapes of the grooves 4a and 4b (groove shape) take place simultaneously. In a photomask used for exposure of the first photosensitive resist, the tuning fork outer shape and the groove shape are formed on one mask substrate. Hence, no aligning error occurs between the tuning fork outer shape and the groove shape, unlike in the conventional case, and the oscillation balance (symmetry) between the first and second oscillation arms 3a and 3b is good. Thus, the CI value of the tuning fork crystal oscillation plate 1 is stably low.

According to this embodiment, after forming the tuning fork outer shape by etching, the electrodes are formed. The photosensitve resist need not coat the entire surface. Before forming the crystal substrate 61 into the tuning fork outer shape, the two sides of the crystal substrate 61 can undergo a series of lithography processes. For this reason, the exposure apparatus can employ an inexpensive contact method or proximity method. Although the number of times of exposure operation is conventionally three, it can be reduced to twice.

In the step described in FIG. 8C of etching the corrosion-resistant films 62, since the corrosion-resistant films 62 are made of only Cr, cell corrosion is small and the etching rate is low. In this step, as the boundary portions and groove portions of the plurality of tuning fork crystal oscillation pieces 1a are removed simultaneously, etching takes about 60 sec. As the etching rate is low, etching can last over a sufficiently long period of time. As the etching lasts over the sufficiently long period of time, portions that should be etched do not remain unetched, and side etching of the corrosion-resistant films 62 does not occur. Hence, the steps 156 and the like which are conventionally formed on the oscillation arms 103a and 103b are not formed, and variations in shape of the oscillation arms 103a and 103b decrease.

When using the conventional manufacturing method, variations in resonant frequency among the plurality of 32.768-kHz tuning fork crystal oscillation plates 101 obtained from the crystal substrate 150 were 500 Hz and over in the crystal substrate 150. In contrast to this, with the manufacturing method of this embodiment, variations in resonant frequency decreased to 150 Hz or less, providing a large effect. As a result, the amount of Au required for forming the frequency adjustment electrodes 10a and 10b at the distal ends of the oscillation arms 3a and 3b decreased to ⅓ or less the conventional amount.

Combinations of the single-sided groove structures of the tuning fork crystal oscillation plates 1, 21, 31, and 41 described above with the novel manufacturing method can achieve a high performance, low investment, and high yields of the crystal oscillators respectively mounted with the tuning fork crystal oscillation plates 1, 21, 31, and 41. When using the tuning fork crystal oscillation plates 1, 21, 31, and 41, the containers to respectively mount the tuning fork crystal oscillation plates 1, 21, 31, and 41 therein can have a box shape or cylinder shape. A crystal oscillator in which such a tuning fork crystal oscillation plate is molded with a resin can be fabricated easily, and applied to a gyro sensor, or combined with an oscillation circuit to constitute a crystal oscillation device. Accordingly, the performance of the tuning fork crystal oscillation plates 1, 21, 31, and 41 largely contributes to downsizing, high performance, and cost reduction of the applied products, thus providing a large effect.

Although the above embodiments exemplified the tuning fork crystal oscillation plates 1, 21, 31, and 41 having a resonant frequency of 32.768 kHz, the present invention can be applied to tuning fork crystal oscillation plates having a resonant frequency of 32 kHz to 200 kHz.

Although the above embodiments exemplify a tuning fork shape having two oscillation arms, the present invention can also be applied to a three-arm tuning fork crystal oscillation plate having three oscillation arms. Gyro sensor elements formed by changing the patterns of the electrodes formed on the surfaces of the tuning fork crystal oscillation pieces 1a and 31a are also included in the scope of the present invention.

As has been described above, according to the above embodiments, the CI value can be decreased even in a crystal oscillator mounted with the very compact tuning fork crystal oscillation plate 1, 21, 31, or 41.

The resonant frequency variations of the tuning fork crystal oscillation plates 1, 21, 31, and 41 in one crystal substrate 61 or among different crystal substrates 61 can be decreased.

The number of steps in manufacturing the tuning fork crystal oscillation plates 1, 21, 31, and 41 can be decreased.

The tuning fork crystal oscillation plates 1, 21, 31, and 41 can be manufactured with an inexpensive facility.

What is claimed is:

1. A tuning fork crystal oscillation plate comprising:
   a tuning fork crystal oscillation piece including a base with a substantially rectangular shape when seen from the top, and at least two oscillation arms extending in the same direction from one side of said base and having substantially rectangular shapes when seen from the top, said at least two oscillation arms including first and second oscillation arms;

first and second grooves which are formed in one main surface of said first oscillation arm and one main surface of said second oscillation arm on the same side, said first groove and said second groove extending from a boundary line of said base with said first and second oscillation arms toward distal ends of said first oscillation arm and said second oscillation arm, said first groove and said second groove having a length that falls within a range of 50% (inclusive) to 70% (exclusive) a length of said first oscillation arm and said second oscillation arm, and said first groove and said second groove having a depth that falls within a range of 50% to 90% (both inclusive) a thickness of said tuning fork crystal oscillation piece;

first and second groove electrodes which are formed on inner surfaces of said first and second grooves, respectively first side surface electrodes which are formed on two side surfaces, respectively, of said first oscillation arm; and second side surface electrodes which are formed on two side surfaces, respectively, of said second oscillation arm, wherein said first groove electrode is connected to said second side surface electrodes to constitute one terminal, and said second groove electrode is connected to said first side surface electrodes to constitute the other terminal.

2. A plate according to claim 1, further comprising:

a first flat electrode formed on the other main surface of said first oscillation arm to oppose said first groove electrode, and connected to said second side surface electrodes together with said first groove electrode; and a second flat electrode formed on the other main surface of said second oscillation arm to oppose said second groove electrode, and connected to said first side surface electrodes together with said second groove electrode.

3. A plate according to claim 1, further comprising:

a first distal end electrode formed on a surface of a distal end of the other main surface of said first oscillation arm and connected to said second groove electrode together with said first side surface electrodes; and a second distal end electrode formed on a surface of a distal end of the other main surface of said second oscillation arm and connected to said first second groove electrode together with said second side surface electrodes, wherein said first distal end electrode and said second distal end electrode adjust a resonant frequency of said tuning fork crystal oscillation plate.

4. A plate according to claim 1, wherein each of said first groove and said second groove comprises at least two grooves which are formed parallel to each other.

5. A plate according to claim 1, wherein each of said first groove and said second groove has one of a substantially trapezoidal section and a substantially V-shaped section in a direction perpendicular to a longitudinal direction thereof.

6. A plate according to claim 1, wherein said first oscillation arm and said second oscillation arm flex upon application of an alternating voltage to said two terminals.

7. A plate according to claim 6, wherein said tuning fork crystal oscillation plate has a resonant frequency of 32 kHz to 200 kHz.

* * * * *